United States Patent [19]
Klass et al.

[11] Patent Number: 6,121,807
[45] Date of Patent: Sep. 19, 2000

[54] SINGLE PHASE EDGE-TRIGGERED DUAL-RAIL DYNAMIC FLIP-FLOP

[75] Inventors: Edgardo F. Klass, Palo Alto; Chaim Amir, Sunnyvale, both of Calif.

[73] Assignee: Sun Microsystems, Inc., Palo Alto, Calif.

[21] Appl. No.: 09/317,656

[22] Filed: May 24, 1999

Related U.S. Application Data

[63] Continuation of application No. 08/710,692, Sep. 19, 1996, Pat. No. 5,920,218.

[51] Int. Cl.$^7$ ..................................................... H03K 3/037
[52] U.S. Cl. .......................... 327/218; 327/200; 327/210; 327/211
[58] Field of Search .................................... 327/200, 210, 327/211, 218

[56] References Cited

U.S. PATENT DOCUMENTS

| | | | |
|---|---|---|---|
| 5,208,489 | 5/1993 | Houston | 307/451 |
| 5,440,243 | 8/1995 | Lyon | 326/33 |
| 5,453,708 | 9/1995 | Gupta et al. | 326/98 |
| 5,461,331 | 10/1995 | Schorn | 327/210 |
| 5,461,649 | 10/1995 | Bailey et al. | 327/28 |
| 5,497,114 | 3/1996 | Shimozono et al. | 327/210 |
| 5,517,136 | 5/1996 | Harris et al. | 326/93 |
| 5,760,627 | 6/1998 | Gregor et al. | 327/215 |

OTHER PUBLICATIONS

Jiren Yuan et al., "New Single–Clock CMOS Latches and Flipflops with Improved Speed and Power Savings," *IEEE Journal of Solid–State Circuits*, vol. 32, 62–69 1997.

N.B. Gaddis et al., "A 56–Entry Instruction Reorder Buffer" *1996 IEEE International Solid–State Circuits Conference*, pp. 212–213 (1996).

H. Partovi et al., "Flow–through Latch and Edge–Triggered Flip–flop Hybrid Elements," *ISSCC Slide Supplement*, p. 104 (1996).

Masakasu Shoji, *CMOS Digtial Circuit Technology*, Prentice Hall NJ, pp. 216–217 (1988).

"Power Saving Latch," *IBM Technical Disclosure Bulletin*, vol. 39, No. 4, pp. 65–66, Apr., 1996.

Jiren Yuan et al., "A True Single Phase Clock Dynamic CMOS Circuit Technique," *IEEE Journal of Solid–State Circuits*, vol. 22, 899–901, 1997.

Jiren Yuan et al., "High Speed Circuit CMOS Circuit Technique," *IEEE Journal of Solid–State Circuits*, vol. 24, 62–70, 1989.

*Primary Examiner*—Margaret R. Warnbach

[57] ABSTRACT

A single phase edge-triggered dual-rail dynamic flip-flop circuit for use with dynamic logic gates includes an input stage, precharge stage and buffer. The input stage is coupled to receive a data-input signal and a clock signal. During the precharge phase, the input stage provides an output signal that is the complement of the data input signal. When the data input signal is provided by a dynamic logic gate, the input stage output signal is precharged to a logic high level. During the evaluation phase, the input stage generates an output signal that either remains at a logic high level or else transitions from high-to-low. The precharge stage receives the output signal from the input stage and the clock signal. During the precharge phase, the precharge stage generates a logic high level output signal independently of the signal received from the input stage. However, the logic high level signal from the input stage turns on hard a n-channel transistor in the precharge stage, which minimizes the delay through the precharge stage during the evaluation phase. During the evaluation phase, the precharge stage outputs the complement of the output signal received from the input stage. The buffer is coupled to receive the output signal from the precharge stage. During both the precharge and evaluation phases, the buffer outputs the complement of the output signal received from the precharge stage.

12 Claims, 4 Drawing Sheets

SINGLE PHASE EDGE-TRIGGERED DUAL-RAIL DYNAMIC FLIP-FLOP

RELATED APPLICATIONS

This application is a continuation of U.S. patent application Ser. No. 08/710,692, entitled "Single-Phase Edge-Triggered Dual-Raid Dynamic Flip-Flop" of Klass et al., filed on Sep. 19, 1996, which issued as U.S. Pat. No. 5,920,218, on Jul. 6, 1999, and which is incorporated herein by reference in its entirety.

FIELD OF THE INVENTION

The present invention relates to digital circuits and, more particularly, to flip-flops. Still more particularly, the present invention relates to a class of flip-flops referred to herein as dynamic flip-flops.

BACKGROUND

Many high performance circuits such as for example, microprocessors, use dynamic logic gates. Dynamic gates generally have shorter delays than conventional static logic gates, which allow the high performance circuit to be faster. Typically, dynamic gates have a precharge phase and an evaluation phase. To ensure correct operation, typical dynamic logic gates require that the input signal received by a dynamic gate must either: (a) be stable before the beginning of the evaluation phase; or (b) transition in only one predetermined direction during the evaluation phase. For example, the dynamic logic gate may require that during the precharge phase, the input signal be at a low voltage level and, thus, only low-to high transitions are allowed during the evaluation phase.

In operation, dynamic logic gates generally cause their output signal(s) to conform to their input signal requirements. For example, a dynamic logic gate that allows low-to-high transitions during evaluation phases generally would cause its output signal(s) to be at logic low level during the precharge phase. Then, during the evaluation phase, the dynamic logic gate would cause the output signal(s) to either remain at a logic low level or transition to a logic high level, depending on the dynamic logic gate's logic operation on the input signal(s) received during the evaluation phase.

A problem arises when static flip-flops are used to drive dynamic logic gates. Conventional static flip-flops generally have uncertainty in when tile flip-flops' output signals become stable. Consequently, depending on the clock rate, the time required for a conventional static flip-flop's output signals to become stable may extend into the evaluation phase of the dynamic logic gate that the static flip-flop is driving. Further, a conventional static flip-flop can, of course, provide outputs that transition in both directions (i.e., from high-to-low output voltage and low-to-high output voltage). These properties of static flip-flops can violate the requirements for driving dynamic logic gates.

One conventional solution is to operate the static flip-flop and dynamic logic gates at a slower clock rate, giving the static flip-flop adequate time to provide stable output signals to the dynamic logic gate before the dynamic logic gate enters the evaluation period. Of course, high clock speeds are desirable in most applications. Thus, this solution may not be practical for many applications. Another conventional solution is to delay the evaluation phase of the dynamic flip-flop until the static flip-flop output signals are stable, as described below in conjunction with FIG. 1.

FIG. 1 is a block diagram illustrating a circuit 100 using a conventional evaluation delay scheme. A static flip-flop 101 has an output lead 103 connected to an input lead 105 of a dynamic logic gate 107. The dynamic logic gate 107 has an output lead 108 connected to an input lead 109 of another dynamic logic gate 111. A clock signal CK is provided to a clock input terminal of tile static flip-flop 101 through a clock line 115. A delay circuit 117 has an input lead 119 connected to the clock line 115, and provides at an output lead 121 a clock signal CKD, which is a delayed version of the clock signal CK. The output lead 121 of the delay circuit 117 is connected to clock input terminals of the dynamic logic gates 107 and 111. In this example, the dynamic logic gates 107 and 111 operate correctly only with stable data input signals or low-to-high transitions during the evaluation phase, and their output signals will be either stable data or low-to-high transitions during this phase.

In the conventional circuit 100, the dynamic logic gates 107 and 111 enter the evaluation phase when the clock signal CKD is high (i.e., during the logic high portion of the clock cycle) and in the precharge phase when the received clock signal is low (i.e., during the logic low portion of the clock cycle). Thus, the delay circuit 117 delays the evaluation phase of the dynamic logic gates 107 and 111 relative to the clock signal CK for a time period Δ. The duration of tile time period Δ is predetermined to ensure that the dynamic logic gate 107 receives a fully stable data signal (i.e., the output signal X from the static flip-flop 101) before the start of the evaluation phase and to account for clock skew and jitter between the signals CK and CKD. Of course, this delay imposes a constraint that limits the frequency of the clock signal CK, which is undesirable in most applications.

FIG. 2 is a timing diagram illustrative of the operation of the circuit 100 (FIG. 1). The waveform 201 represents the clock signal CK, which is received by the static flip-flop 101 (FIG. 1). The delay circuit 117 also receives the clock signal CK, which it delays by the time period Δ to generate the signal CKD, represented by the waveform 203. The delay circuit 117 introduces skew and jitter, as indicated by multiple-rising edges 204 of the waveform 203. For timing purposes, the maximum skew (i.e., the last rising edge 205 of the edges 204) is used in determining the speed of the circuit.

On the rising edge of the clock signal CK, the flip-flop 101 loads in a logic value received at its input terminal, and then generates an output signal X after a short propagation delay, represented by the waveform 207. Because the flip-flop 101 is a static flip-flop, the output signal X may transition from either high-to-low or low-to-high, as shown by the waveform 207.

The output signal X is received at the data input terminal of the dynamic logic gate 107 (FIG. 1). At the end of the time period Δ (measured from the rising edge of the clock signal CK), the output signal X is fully stable and the rising edge of the delayed clock signal CKD causes the dynamic logic gates 107 and 111 (FIG. 1) to enter the evaluation phase. As a result, the dynamic logic gate 107 operates on the signal X to generate an output signal Y, which is represented by the waveform 209. The output signal Y is received by the dynamic logic gate 111. In this example, the output signal Y makes a low-to-high transition during the evaluation phase, after a propagation delay incurred by the dynamic logic gate 107.

Ideally, the dynamic gate 107 would start operating on its input signal immediately upon the end of the propagation delay from the flip-flop 101. As shown in FIG. 2, the circuit 100 (FIG. 1) does not achieve this goal. The time period between the rising edge 205 and the end of the propagation delay of the static flip-flop 101 is the time penalty incurred by using the static flip-flop 101. Thus, there is a need for a flip-flop for use with dynamic logic gates that eliminates this time penalty.

SUMMARY

In accordance with the present invention, a single phase dynamic flip-flop circuit is provided. Embodiments of this invention are advantageously used in applications in which a dynamic logic gate drives the dynamic flip-flop and in which the dynamic flip-flop circuit drives other dynamic logic gates. Although embodiments of the invention are summarized in conjunction with a dynamic logic gate driving the dynamic flip-flop for optimal performance, the dynamic flip-flop circuit can be driven by static logic gates as well.

In a single-rail embodiment, the dynamic flip-flop circuit includes a input stage, a precharge stage and buffer. The input stage is coupled to receive a data-input signal and a clock signal. During the precharge phase, the input stage provides an output signal that is a function of the logic level of the data-input signal. In this embodiment, the input stage provides an output signal that is the complement of the data input signal. Consequently, because the data input signal is provided by a dynamic logic gate (which typically provide a logic low level during the precharge phase), the input stage output signal is precharged to a logic high level.

During the evaluation phase, the input stage provides an output signal as a function of the data input signal. In one embodiment, the input stage generates a logic low output signal when the data input signal being at a logic high level, but allows the voltage at the input stage output lead to float at about the logic high level when the data input signal is at a logic low level. Consequently, once the output lead of the precharge circuit is discharged to a logic low level during the evaluation phase, the input stage's output signal cannot transition to a logic high level. As a result, during the evaluation phase, the input stage generates an output signal that either remains at a logic high level or else transitions from high-to-low.

In another embodiment, the input stage has a keeper circuit to maintain the logic high level at the output lead of the input stage when the data input signal is at a logic low level. The keeper circuit helps prevent parasitic discharge of the input stage's output lead during the evaluation phase, which is connected to the gate of a n-channel device in the precharge stage. As a result, this n-channel device is ensured to be turned on hard at the start of the evaluation phase, thereby advantageously minimizing the delay through the precharge stage.

The precharge stage receives the output signal from the input stage and the clock signal. During the precharge phase, the precharge stage generates an output signal of a predetermined logic level independently of the output signal provided by the input stage. In this embodiment, the predetermined logic level is a logic high level.

However, during the evaluation phase, the precharge stage provides an output signal that is a function of the output signal received from the precharge phase. In one embodiment, the precharge stage provides a logic low output signal when the input stage's output signal is at a logic high level, but allows the voltage at the precharge stage's output lead to float at about the logic high level when the input stage's output signal is at a logic low level. Thus, the precharge stage outputs the complement of the output signal received from the input stage. In another embodiment, the precharge stage includes a keeper circuit to maintain the logic high level at the output lead of the precharge stage during the evaluation phase when the input stage's output signal is at a logic low level.

The buffer is coupled to receive the output signal from the precharge stage. During both the precharge and evaluation phases, the buffer provides an output signal as a function of the logic level of the output signal received from the precharge stage. In this embodiment, the buffer outputs the complement of the output signal received from the precharge stage.

As described above, during the evaluation phase, the input stage generates an output signal that either remains at a logic high level or else transitions from high-to-low, which then propagates through the precharge stage and the buffer stage. Thus, the dynamic flip-flop circuit's output signal is either stable or else makes a low-to-high transition, thereby meeting the requirements for driving dynamic logic gates. Accordingly, unlike for static flip-flops, the clock signal provided to dynamic gates driven by this flip-flop need not be delayed. In addition, by having the n-channel device in the precharge stage turned on hard during the precharge phase, the delay through the precharge stage is minimized when the precharge stage's output signal transitions.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION

Figure 1:
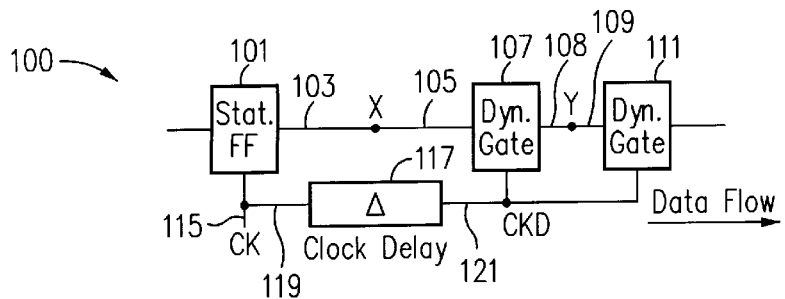
FIG. 1 is a block diagram of a circuit with a conventional static flip-flop driving dynamic logic gates.
Figure 3:
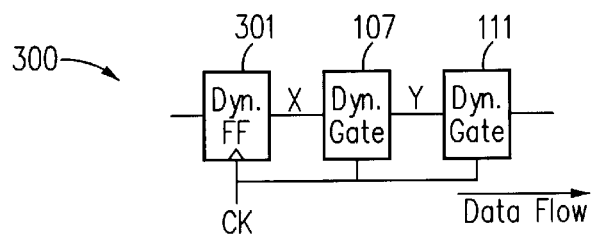
FIG. 3 is a block diagram of a circuit with a dynamic flip-flop driving dynamic logic gates.

FIG. 3 is a block diagram of a circuit 300 including a dynamic flip-flop flop 301 driving dynamic logic gates 107 and 111. Like reference numbers are used between drawings for elements having substantially identical structure and function. The circuit 300 is similar to the circuit 100 (FIG. 1) except that circuit 300 omits the delay circuit 117 and uses the dynamic flip-flop 301 instead of the static flip-flop 101 (FIG. 1). The dynamic flip-flop 301 can be substantially identical to the flip-flops described below in conjunction with FIGS. 6 and 7. The dynamic flip-flop 301 provides the output signal X so that the output signal X meets the input signal requirements of the dynamic logic gates 107 and 111. More specifically, the output signal X is either stable before the evaluation phase or only transitions from low-to-high during the evaluation phase. As a result, the clock signal received by the dynamic logic circuits 107 and 111 need not be delayed relative to the time the flip-flop 301 receives the clock signal, unlike conventional circuits using static flip-flops. Thus, the dynamic logic gates 107 and 111 receive the clock signal CK at approximately the same time as the dynamic flip-flop 301.

Figure 2:
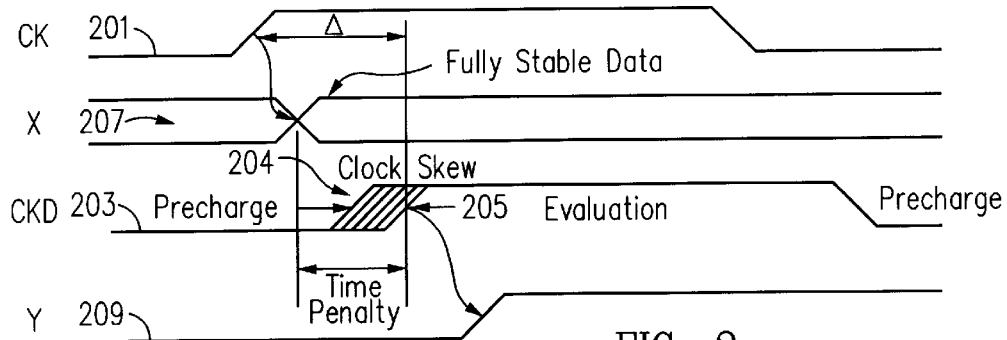
FIG. 2 is a timing diagram illustrative of the operation of the circuit depicted in FIG. 1.
Figure 4:
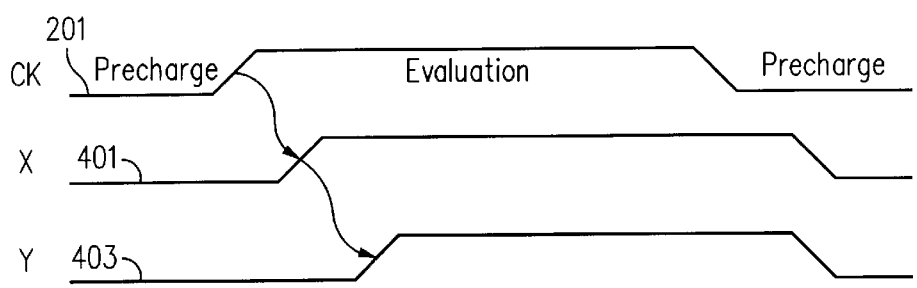
FIG. 4 is a timing diagram illustrative of the operation of the circuit depicted in FIG. 3.

FIG. 4 is a timing diagram illustrative of the operation of the circuit 300 (FIG. 3). Similar to FIG. 2, the waveform 201 represents the clock signal CK, which causes the flip-flop 301 to enter the precharge phase when at a logic low level and the evaluation phase when at a logic high level. The waveform 401 represents the output signal X provided by the dynamic flip-flop 301 (FIG. 3). In this example, the dynamic flip-flop 301 receives a logic high data input signal at the rising edge of the clock signal CK and after a relatively short propagation delay, causing the signal X to transition to a logic high level. If the data input signal was at a logic low level, the signal X would remain at a logic low level. Thus, the signal X is either stable at the logic low level or transitions from low-to-high, in keeping with the input signal requirements of the dynamic logic gate 107.

In response to the low-to-high transition of the signal X in this example, the dynamic logic gate 107 causes the signal Y to transition from low-to-high, which is then received by the dynamic logic gate 111. Consequently, as shown in FIG. 4, the waveform 403 representing the signal Y, transitions to a logic high level after only two relatively short propagation delays after the rising edge of the clock signal CK. Of course, these two propagation delays are significantly shorter than the two propagation delays plus the time penalty (see FIG. 2) required by the conventional static flip-flop circuit 100 (FIG. 1). As a result, the clock signal CK may have a higher frequency in the circuit 300 than in the circuit 100.

Figure 5:
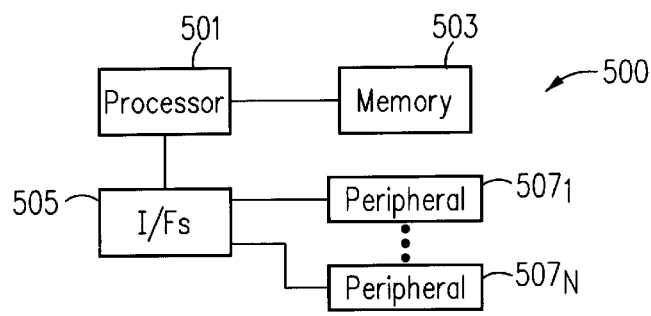
FIG. 5 is a block diagram of an electronic system that includes a dynamic flip-flop according to one embodiment of the present invention.

FIG. 5 is a block diagram of an electronic system 500 according to one embodiment of the present invention. The electronic system 500 includes an integrated circuit 501 with a dynamic flip-flop (described below in conjunction with FIGS. 6–11), a memory 503, interfaces 505 and peripherals 507$_1$–507$_N$. The dynamic flip-flop is used to drive one or more dynamic logic gates in the integrated circuit 501.

The electronic system 500 can be any type of electronic system. In this embodiment, the electronic system 500 is a computer system in which the integrated circuit 501 is a processor connected to the memory 503 and to interfaces 505. The processor can be any type of processor such as, for example, X86, Sparc®, Alpha®, MIPS®, HP®, and PowerPC® processors. The interfaces 505 are connected to peripherals 507$_1$–507$_N$, thereby allowing the processor to interact with these peripherals. The memory 503 and the interfaces 505 can be any type of memory or interface for use in computer systems. Likewise, the peripherals can be any type of peripheral such as, for example, displays, mass storage devices, keyboards or any other type of input or input-output device.

In accordance with the present invention, the dynamic flip-flop in the integrated circuit 301 provides an output signal that is either at a first logic level or else transitions from the first logic level to a second logic level during an evaluation phase. This feature allows the dynamic flip-flop to be advantageously used to drive dynamic logic gates without an additional interface and without the time penalty incurred when using static flip-flops. Thus, the electronic system 500 can be operated at a faster clock rate compared to systems using static flip-flops to drive dynamic logic gates, thereby improving the performance of the system.

Figure 6:
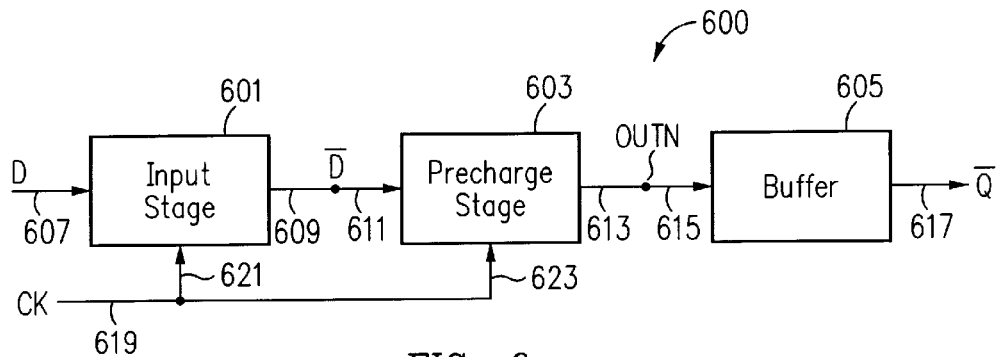
FIG. 6 is a block diagram of a dynamic flip-flop circuit according to one embodiment of the present invention.

FIG. 6 is a block diagram of a dynamic flip-flop circuit 600 according to one embodiment of the present invention. In this embodiment, the dynamic flip-flop circuit 600 is a single phase (i.e., not requiring the complement of the clock signal) single rail flip-flop circuit (i.e., only outputting a single output signal). The dynamic flip-flop circuit 600 includes an input stage 601, an precharge stage 603 and a buffer 605.

The input stage 601 receives a data input signal D through a lead 607, which is connected to the data input terminal (not shown) of the dynamic flip-flop circuit 600. The input stage 601 also has an output lead 609 connected to an input lead 611 of the precharge stage 603. The precharge stage 603 has an output lead 613 connected to an input lead 615 of the buffer 605 through an output node OUTN. The buffer 605 has an output lead 617 connected to the $\overline{Q}$ output terminal (not shown) of the dynamic flip-flop circuit 600. In addition, the input stage 601 and the precharge stage 603 are coupled to receive a clock signal CK through a lead 619, which is connected to the clock input terminal (not shown) of the dynamic flip-flop circuit 600. The input stage 601 and the precharge stage 603 respectively receive the clock signal CK through input leads 621 and 623, which are connected to the lead 619. The dynamic flip-flop circuit 600 enters the precharge phase when the clock signal CK transitions to the logic low level and enters the evaluation phase when the clock signal CK transitions to the logic high level.

In the precharge phase, the precharge stage 603 is operative to generate an output signal at the output lead 613 with a predetermined logic level, independent of the logic level of the signal received at the input lead 611. In this embodiment, the precharge stage generates a logic high level signal at the output lead 613. Consequently, the precharge stage 603 causes the node OUTN to be at a logic high level during the precharge phase for any logic level of the signal received at the input lead 611. The buffer 605 is an inverting buffer in this embodiment and, as a result, outputs a logic low level signal at the output lead 617 during the precharge phase.

The dynamic flip-flop circuit 600 operates during the evaluation phase as follows. The input stage 601 receives the data input signal D at the input lead 607 and, in response, provides at the output lead 609 an output signal dependent on the data input signal D. In this embodiment, the input stage outputs a signal $\overline{D1}$, which is the complement of the data input signal D. As will be described below, this embodiment is advantageously used in applications in which a dynamic logic gate (not shown) is used to provide the data input signal D to the dynamic flip-flop circuit 600. Consequently, before the start of the evaluation phase, the data signal D will be at a logic low level and, thus, the input stage 601 will output a logic high level at the output lead 609. Thus, before the start of the evaluation phase, the input stage 601 precharges the output lead 609 to a logic high level. Then, depending on the logic level of the data input signal D at about the start of the evaluation phase, the input stage 601 may cause the signal $\overline{D1}$ to transition to a logic low level or else remain at the logic high level from the precharge phase. In this embodiment, the input stage 601 is implemented so that once the voltage at the output lead 609 transitions to a logic low level, the input stage 601 cannot again charge the output lead 609 during the same evaluation phase. Therefore, during an evaluation phase, the input stage 601 provides an output signal that either remains stable at a logic high level, or else transitions from the logic high level to a logic low level (high-to-low).

In addition, the transition to the evaluation phase causes the precharge stage 603 to generate an output signal having a logic level dependent on the logic level of the signal generated by the input stage 601 and received at the input lead 611. In this embodiment, the precharge stage 603 provides an output signal that is the complement of the signal received at the input lead 611. Because the input stage 601 provides the signal $\overline{D1}$, the precharge stage 603 provides a signal that is logically equivalent to the data input signal D.

The precharge stage 603 is implemented in this embodiment so that during the evaluation phase, the output signal of the precharge stage 603 either remains stable at the logic high level of the precharge phase, or else transitions from high-to-low. The buffer 605 receives the output signal from the precharge stage 603 and generates the output signal $\overline{Q}$. Because during the evaluation phase the output signal from the precharge stage 603 remains either remains stable at a logic high level or else transition from high-to-low, the output signal $\overline{Q}$ is either stable at a logic low level or else transitions from low-to-high. Accordingly, the dynamic flip-flop circuit 600 meets the requirements for driving dynamic logic gates without introducing a delay in the clock signal, as is required when using static flip-flops to drive dynamic logic gates. As a result, a circuit using flip-flop circuit 600 may be operated at a faster clock than possible for a circuit using conventional static flip-flops.

Figure 7:
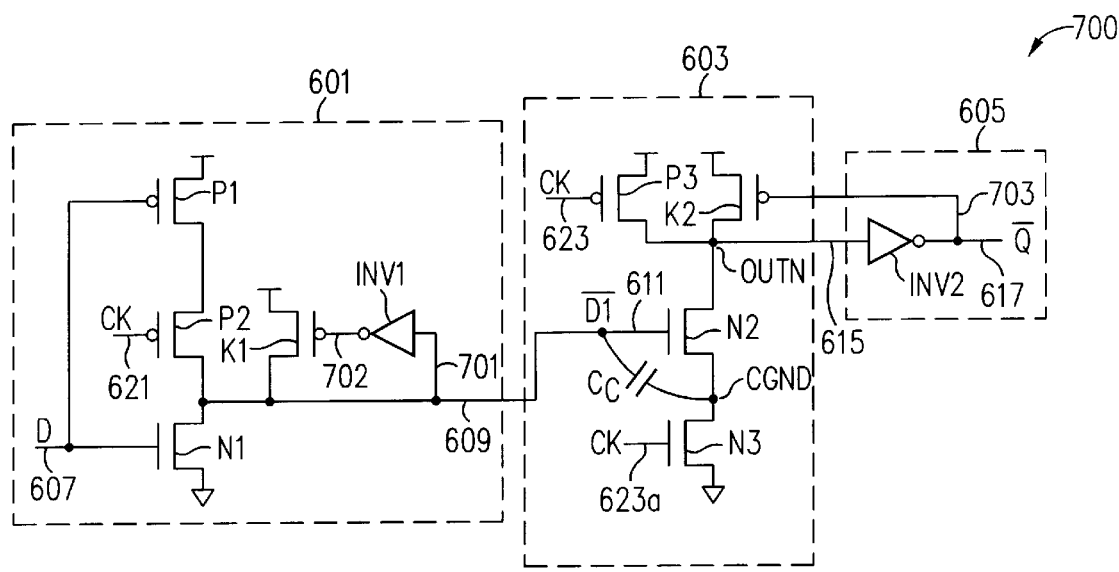
FIG. 7 is a schematic diagram of a dynamic flip-flop implementing the block diagram of FIG. 6, according to one embodiment of the present invention.

FIG. 7 is a schematic diagram of a dynamic flip-flop circuit 700 implementing the block diagram of FIG. 6, according to one embodiment of the present invention. In this embodiment, the input stage includes p-channel transistors P1, P2 and K1, a n-channel transistor N1 and an inverter INV1. The p-channel transistor P1 has a source coupled to a VDD voltage source (not shown), a gate connected to the input lead 607 and a drain connected to the source of the p-channel transistor P2. The p-channel transistor P2 has a gate connected to the clock input lead 621 and a drain connected to the output lead 609. The n-channel transistor N1 has a drain connected to the output lead 609, a gate connected to the data input lead 607, and source coupled to a VSS voltage source (not shown).

This embodiment of the input stage 601 also includes the p-channel transistor or keeper device K1, which has a source coupled to the VDD voltage source, a drain connected to the output lead 609, and a gate coupled to the output lead 609 through the inverter INV1. More specifically, tile inverter INV1 has an input lead 701 connected to the output lead 609 and an output lead 702 connected to the gate of the keeper device K1. The keeper device K1 helps to hold a logic high voltage level on the lead 609 at about the VDD voltage. In other embodiments, the keeper device K1 and the inverter FNV1 may be omitted at the risk of discharge of the output lead 609 (from capacitive coupling or leakage) when the dynamic flip-flop circuit 600 is in the evaluation phase.

The precharge stage 603 includes two p-channel transistors P3 and Y2 and two n-channel transistors N2 and N3. The p-channel transistor P3 has a source coupled to the VDD voltage source, a gate connected to the clock input lead 623, and drain connected to the output lead 615 at a node OUTN. The p-channel transistor K2 has a source coupled to the VDD voltage source, a gate connected by a lead 703 to the output lead 617 of the buffer 605, and a drain connected to the node OUTN. The n-channel transistor N2 has a drain connected to the node OUTN, a gate connected to the input lead 611 of the precharge stage 603, and a source connected to a node CGND. A capacitor $C_c$ is shown connected between the gate and source of the n-channel transistor N2 to model the capacitance coupling between the gate and source. The n-channel transistor N3 has a drain connected to the node CGND, a gate coupled to receive the clock signal CK through a lead 623a, and a source coupled to the VSS voltage source.

The buffer 605 includes an inverter INV2. The leads 615 and 617 of the buffer 605 serve as the inverter's input and output leads, respectively. In this embodiment, the inverter INV2 is a conventional CMOS inverter. In a further refinement, the sizes of the p-channel and n-channel devices implementing the inverter can be adjusted to increase the speed of low-to-high transitions. Because low-to-high transitions will normally occur only during the evaluation phase, this refinement reduces the delay through the buffer 605. The slower high-to-low transitions caused by this refinement do not adversely affect the forward delay of the buffer 605 because such transitions will normally occur only during the precharge phase.

Precharge Phase

Figure 8:
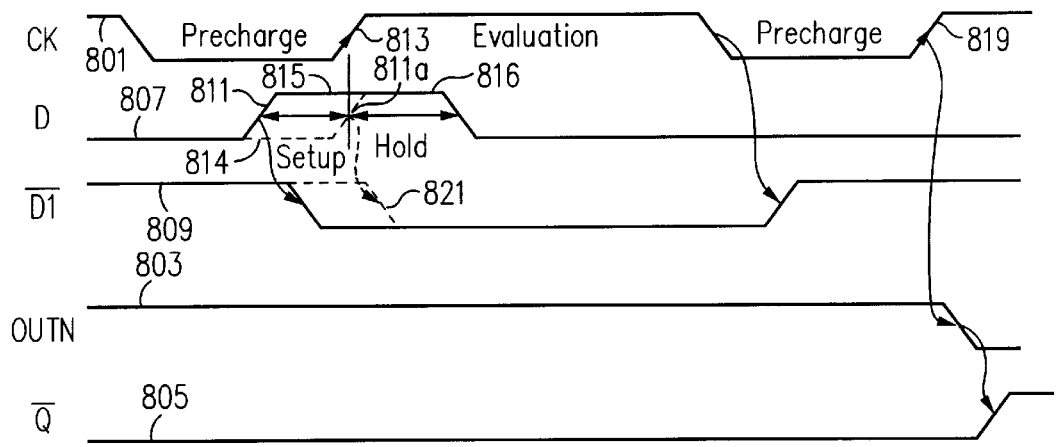
FIG. 8 is a timing diagram illustrative of the operation of the dynamic flip-flop depicted in FIG. 7.

Referring to FIGS. 7 and 8, the dynamic flip-flop circuit 700 operates during the precharge phase as follows. In this example, the dynamic flip-flop circuit 700 is driven by a dynamic logic gate (not shown) of the domino type. The gates of transistors P2, P3 and N3 receive the clock signal CK, which is represented by the waveform 801 in FIG. 8. Consequently, during the precharge phase (i.e., when the clock signal CK is at a logic low level), the transistors P2 and P3 are on, while n-channel transistor N3 is off. Because the transistors P3 and N3 are respectively on and off, the p-channel transistor P3 pulls up the voltage at the node OUTN, which is represented by the waveform 803. The inverter INV2 of the buffer 605 receives the logic high level at the node OUTN and outputs a logic low level $\overline{Q}$ signal, which is represented by the waveform 805. Because the n-channel transistor N3 is off, the precharge stage 603 operates to provide a logic low $\overline{Q}$ signal during the precharge phase independently of the signal received on the input lead 611 of the precharge stage 603.

The logic low level of the $\overline{Q}$ signal turns on the keeper device K2, helping to maintain the voltage at the node OUTN at a logic high level. In other embodiments, the keeper device K2 may be omitted.

The transistors P1 and N1 of the input stage 601 receive at their gates the data input signal D, which is represented by the waveform 807. During the precharge phase, the p-channel transistor P2 is on, thereby allowing the transistors P1 and N1 to operate as a conventional CMOS inverter. Consequently, during the precharge phase, the input stage 601 outputs at the lead 609 the signal $\overline{D1}$, which is represented by the waveform 809. Because a dynamic logic gate is providing the data input signal D, the data signal D is at a logic low level during the precharge phase, except for the setup time required for the dynamic flip-flop circuit 700. However, as described further below in conjunction with the evaluation phase, the setup time for the dynamic flip-flop circuit 700 when driven by a dynamic logic gate is approximately zero, and can be negative. Thus, the rising edge 811 of the data input signal D can be substantially coincident in time with the rising edge 813 of the clock signal CK, as illustrated by the dashed line portion 814 of the waveform 807.

Evaluation Phase The dynamic flip-flop circuit 700 operates during the evaluation phase as follows. As described above, before the start of the evaluation phase the voltage at the input lead 611 of the precharge stage 603 is precharged to turn on hard the n-channel transistor N2. Thus, the signal $\overline{D1}$ is at a logic high level. Because the data signal D is provided by a dynamic logic gate, the data signal D either transitions from low-to-high or else remains at a logic low level.

In the case in which the data input signal remains at a logic low level, on the rising edge 819 of the clock signal CK (i.e., the start of the second evaluation phase), the p-channel transistor P3 turns off and the n-channel transistor N3 turns on. Because the n-channel transistor N2 is on hard, the delay through the precharge stage 603 is determined by the delay in turning on the n-channel transistor N3. The delay of the n-channel transistor N3 is relatively small because of the large device size typical of evaluation devices. In one embodiment, the n-channel transistor N3 is about twice the size of the n-channel transistor N2. In some embodiments, the size of the n-channel transistor N3 is increased even more to further reduce the delay through the precharge stage 603.

The keeper device K1 and the inverter INV1 operate to maintain the voltage of the signal $\overline{D1}$ at about the VDD voltage, thereby ensuring that the n-channel transistor N2 is on hard during the evaluation phase despite any discharge through the capacitive coupling between the gate and source of the n-channel transistor N2. In other embodiments, the keeper device K1 and inverter INV1 can be omitted, but the discharge may cause the n-channel transistor N2 to be less conductive, which can degrade the speed of the precharge stage 603.

In the case where the data input signal D transitions from low-to-high before the start of the evaluation phase, the rising edge 811a of the data signal D turns on the n-channel transistor N1 of the input stage 601 and turns off the p-channel transistor P1. Thus, the n-channel transistor N1 pulls down the voltage at the output lead 609, thereby causing the signal $\overline{D1}$ to transition to a logic low level as indicated by the falling edge 821. The logic low level of the signal $\overline{D1}$ operates to turn off the n-channel transistor N2, which prevents discharge of the node OUTN. As a result, the Q output signal remains at a logic low level. In a further refinement, the transistors of the input stage 601 can be sized to achieve a switching threshold of approximately half the supply voltage, thereby optimizing noise immunity.

The setup time of the dynamic flip-flop circuit 700 is essentially equal to the time needed to discharge the gate of the n-channel transistor N2 and turn it off to prevent the discharge of the node OUTN. However, the n-channel transistor N2 will not conduct a significant amount of charge until the node CGND is discharged by the n-channel transistor N3. Consequently, the setup time is, in effect, the difference between the time needed to discharge the node CGND and the time needed to discharge the gate of the n-channel transistor N2. Because the node CGND is precharged to about the VDD voltage minus a threshold voltage, this difference is about zero, or even negative. Accordingly, the setup time is approximately zero, or even slightly negative. The hold time of the dynamic flip-flop 700 is about zero also because once the signal $\overline{D1}$ transitions to a logic low level during the evaluation phase, it cannot be pulled up again. More specifically, the p-channel transistor P2 is turned off during the evaluation phase and the logic low level of the signal $\overline{D1}$ causes the inverter INV1 to turn off the keeper device K1 and, thus, if the data input signal were to transition again to a logic low level, the signal $\overline{D1}$ would simply float at about the VSS voltage.

In a further refinement, a n-channel transistor having a gate connected to the output lead 702 of the inverter INV1, a source coupled to the VSS voltage source, and a drain connected to the lead 609 can be added to the input stage 601 to prevent the signal $\overline{D1}$ from floating low.

A further advantage of the dynamic flip-flop circuit 700 is that only a single phase clock signal is required. Thus, the clock distribution system in the application can be simplified and avoids potential problems caused by skew between the complementary clock signals.

Figure 9:
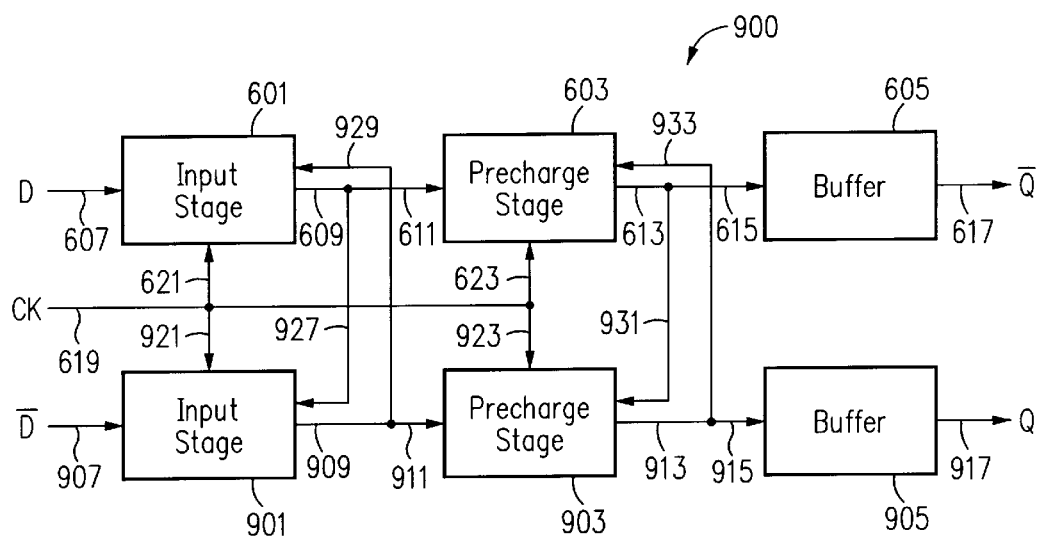
FIG. 9 is a block diagram of another embodiment of a dynamic flip-flop according to the present invention.

FIG. 9 is a block diagram of a dynamic flip-flop circuit 900 according to a dual-rail embodiment of the present invention. The dynamic flip-flop circuit 900 is basically two sets of the dynamic flip-flop circuit 600 (FIG. 6) with the input stages and the precharge stages having cross-coupled Output signals (described further below). More specifically, the dynamic flip-flop circuit 900 includes the dynamic flip-flop circuit 600 and a second input stage 901, a second precharge stage 903 and a second buffer 905, which are substantially identical in structure to the input stage 601, precharge stage 603 and the buffer 605, respectively. The dynamic flip-flop circuit 900 is advantageously used in dynamic logic gate applications in which a dual-rail dynamic logic gate also provides the dual rail input signals to the dynamic flip-flop circuit 900.

The input stage 901, precharge stage 903 and the buffer 905 are interconnected with each other in a substantially identical manner as the corresponding structures in the dynamic flip-flop circuit 600 (FIG. 6). However, the input stage 901 is connected to receive the $\overline{D}$ input signal (the complement of the data input signal D) and the buffer 905 outputs the $\overline{Q}$ signal instead of the $\overline{Q}$ signal. More specifically, the input stage 901 receives a $\overline{D}$ signal through an input lead 907 and provides an output signal at an output lead 909. The precharge stage 903 has an input lead 911 connected to the output lead 909 of the input stage 901 and provides an output signal at an output lead 913. The output lead 913 is connected to an input lead 915 of the buffer 905, which provides the Q output signal at an output lead 917.

In addition, the input stage 901 and the precharge stage 903 receive the clock signal CK through input leads 921 and 923, respectively, which are connected to the clock line 619. Thus, the input stage 901, precharge stage 903 and the buffer 905 operate in a substantially symmetrical manner as the input stage 601, precharge stage 603 and the buffer 605.

In this embodiment, the output lead 609 of the input stage 601 is connected to the input stage 901 through a lead 927. Similarly, the output lead 909 of the input stage 901 is connected to the input stage 601 through a lead 929. This cross-coupling of output signals is used to increase the transition speed of the output signals of the input stages, as described below in conjunction with FIG. 10. Similarly, the precharge stages 603 and 903 have cross-coupled output signals through leads 931 and 933 to increase transition speed of the precharge stages' output signals.

Figure 10:
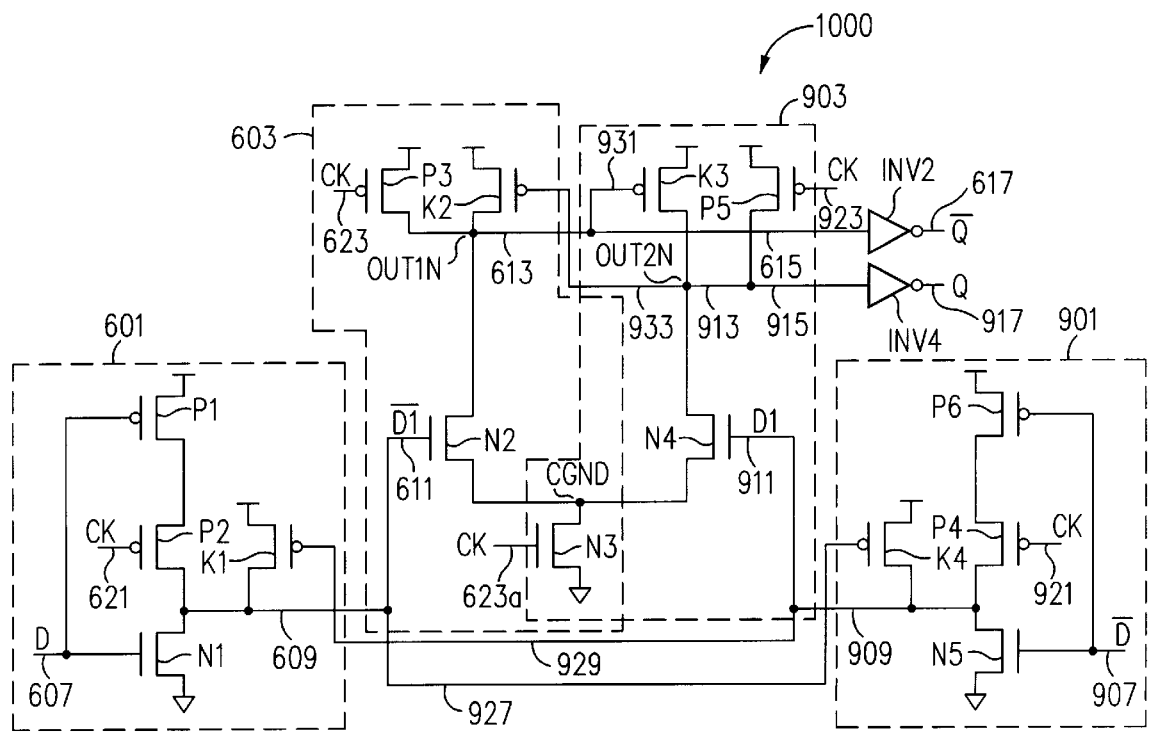
FIG. 10 is a schematic diagram of a dynamic flip-flop implementing the block diagram of FIG. 9, according to one embodiment of the present invention.

FIG. 10 is a schematic diagram of a dynamic flip-flop circuit 1000 implementing the block diagram of FIG. 9, according to one embodiment of the present invention. This dual-rail embodiment basically combines two single-rail dynamic flip-flop circuits 600 (FIG. 7), except that the keeper devices are cross-coupled, thereby eliminating the need for the inverter INV1 (FIG. 7). In this embodiment, the n-channel transistor N3 is shared. Accordingly, the "single-rail" subcircuit of the dynamic flip-flop circuit 1000 operates in a manner similar to the dynamic flip-flop circuit 700 (FIG. 7), except that the switching operation of each single-rail subcircuit is complementary during the evaluation phase.

More specifically, the input stage 901 includes p-channel transistors K4, P4 and P6 corresponding respectively to p-channel transistors K1, P2 and P1 of input stage 601, and n-channel transistor N5 corresponding to n-channel transistor N1. These transistors are interconnected as described above for corresponding transistors in the input stage 601 (FIG. 7) except for the keeper device K4. The transistors P4, P6 and N5 operate as described above for the input stage 601 (FIG. 7).

In this embodiment, the drain of the keeper device K1 is connected to the gate of the keeper device K4 through lead 927, whereas the gate of the keeper device K1 is connected to the drain of the keeper device K4 through the lead 929. As a result, when the data input signal D is at a logic high level, the n-channel transistor N1 is on, thereby causing the voltage at the output lead 609 to be at a logic low level. The logic low level at the output lead 609 turns on the keeper device K4. Conversely, when the data input signal $\overline{D}$ is at a logic high level, the n-channel transistor N5 is on, thereby causing the voltage at the output lead 909 to be at a logic low level. The logic low level at the output lead 909 turns on the keeper device K1. Because the clock signal CK and the D and $\overline{D}$ signals are at a logic low level during the precharge phase, and because the clock signal CK is at a logic low level, the voltage at lines 609 and 909 are pulled up to a logic high level by the p-channel transistors P1, P2, P6 and P4. The logic high level at lines 609 and 909 cause both keeper devices (i.e., p-channel transistors K1 and K4) to be off. Consequently, at the start of the evaluation phase, the switching input stage does not have to "fight" its keeper device to discharge its output lead, thereby increasing the transition speed. Then, the keeper device of the non-switching input stage is turned on, thereby keeping the output lead of the non-switching input stage at a logic high level during the evaluation phase.

The switching stage 903 includes transistors N4, P5 and K3 corresponding to the transistors N2, P3 and K2 of the precharge stage 603 (FIG. 7), respectively. The switching stage 903 shares the n-channel transistor N3 with the precharge stage 603. These transistors are interconnected as described above for corresponding transistors in the precharge stage 603 (FIG. 7), except for the keeper device K3. The transistors P5 and N4 operate as described above for the corresponding transistors in the precharge stage 603 (FIG. 7).

In this embodiment, the drain of the keeper device K2 is connected to the gate of the keeper device K3 through lead 931, whereas the gate of the keeper device K2 is connected to the drain of the keeper device K3 through the lead 933. As a result, logic low levels at the nodes OUT1N and OUT2N (i.e., the output lead 913 of the precharge stage 903) turn on the keeper devices K3 and K2, respectively. Similarly, logic high levels at the nodes OUT1N and OUT2N turns off the keeper devices K3 and K2. Because during the precharge phase the nodes OUT1N and OUT2N are at logic high levels, the keeper devices K3 and K2 are turned off. Consequently, at the start of the evaluation phase, the switching precharge stage does not have to "fight" its keeper device to discharge its output node, thereby increasing the transition speed. Then, the keeper device of the non-switching precharge stage is turned on, thereby keeping the voltage at the output node of the non-switching precharge stage at a logic high level during the evaluation phase.

Figure 11:
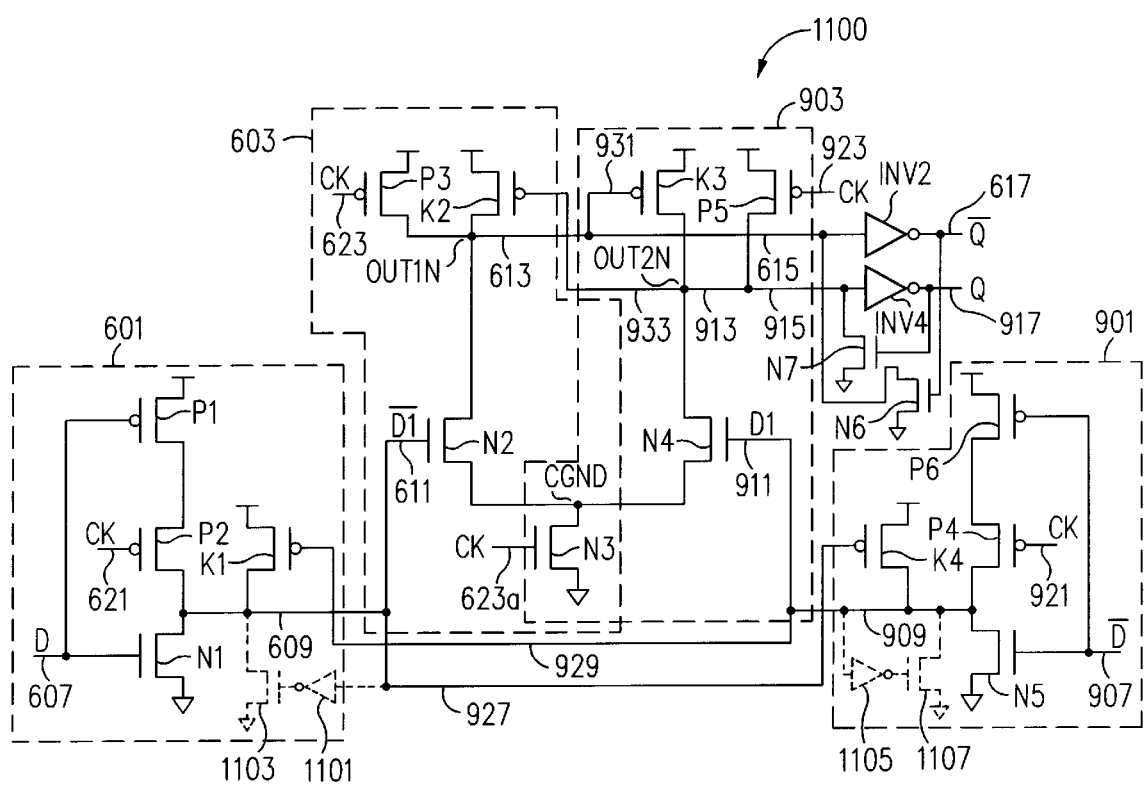
FIG. 11 is a schematic diagram of a dynamic flip-flop implementing the block diagram of FIG. 9, according to another embodiment of the present invention.

FIG. 11 is a schematic diagram of a dynamic flip-flop circuit 1100 according to another embodiment of the present invention. The dynamic flip-flop circuit 1100 is substantially similar to the dynamic flip-flop circuit 1000 (FIG. 10), except that the dynamic flip-flop circuit 1100 includes n-channel transistors N6 and N7. The n-channel transistor N6 has: a gate connected to the output lead 617 of the inverter INV2; a drain connected to the node OUT1N; and source coupled to the VSS voltage source. Accordingly, when the node OUT1N is at a logic low level, the inverter INV2 outputs a logic high signal that turns on the n-channel transistor N6. Thus, the n-channel transistor N6 helps pull down the voltage at the node OUT1N, which serves to keep the node OUT1N from floating if the n-channel transistor N2 were to turn off during the evaluation phase. Similarly, the n-channel transistor N7 is connected to the node OUT2N and the output lead 917 of the inverter INV4 to pull down the voltage at the node OUT2N when the inverter INV4 outputs a logic high signal, and thereby prevent the node OUT2N from floating low if the n-channel transistor N4 were to turn off during the evaluation phase.

The dynamic flip-flop circuit 1100 operates in a substantially identical manner as the dynamic flip-flop circuit 1000. The added n-channel transistors help prevent the nodes OUT1N and OUT2N from floating low, respectively. In another embodiment, n-channel transistors may be connected to the lines 609 and 909 through inverters to prevent floating if the n-channel transistor N1 (or N5) were to turn of during the evaluation phase after pulling the voltage at the line 609 (or 909) to a logic low level. More specifically, in this alternative embodiment, an inverter 1101 (shown in dashed lines) has an input lead connected to the line 609 and an output lead connected to the gate of a n-channel transistor 1103 (shown in dashed lines). The n-channel transistor 1103 has a drain connected to the line 609 and a source coupled to the VSS voltage source. As a result, when the n-channel transistor is on and pulls down the voltage at the line 609, the inverter outputs a logic high level, turning on the n-channel transistor 1103 to help keep the voltage at the line 609 at about the VSS voltage. Thus, if the n-channel transistor N1 were to turn off during the evaluation phase, the n-channel transistor 1103 would prevent the line 609 from floating. Similarly, an inverter 1105 and n-channel transistor 1107 are connected to the line 909 to prevent line 909 from floating low during the evaluation phase.

The embodiments of the dynamic flip-flop described above are illustrative of the principles of this invention and are not intended to limit the invention to the particular embodiments described. For example, those skilled in the art of flip-flops can implement an NMOS (or other transistor technology) embodiment in view of this disclosure without undue experimentation. Those skilled in the art of flip-flops can also implement a "complementary" embodiment, in which the dynamic flip-flop circuit has "series" p-channel devices and n-channel "hold" devices. Further, relatively simple logic functions can be placed inside the dynamic flip-flop circuit in other embodiments. Thus, for example, a three-input multiplexer or an exclusive-OR logic function can be implemented. Accordingly, while the preferred embodiment of the invention has been illustrated and described, it will be appreciated that in view of the present disclosure, various changes can be made therein without departing from the spirit and scope of the invention.

The embodiments of the invention in which an exclusive property or privilege is claimed are defined as follows:

1. A circuit capable of operating in a first phase and a second phase, said circuit comprising:

a first stage having a first input lead, a second input lead and an output lead, said first input lead of said first stage coupled to receive a first signal and said second input lead of said first stage coupled to receive a second signal, wherein:

during said first phase, said first stage is operative to provide at said output lead of said first stage an output signal as a function of a logic level of said first signal received at said first input lead of said first stage, and during said second phase, said first stage is operative to provide at said output lead of said first stage an output signal as a function of the logic level of said first signal received at said first input lead of said first stage;

a second stage having a first input lead coupled to said output lead of said first stage, a second input lead coupled to said second input lead of said first stage, and an output lead, wherein:

during said first phase, said second stage is operative to provide at said output lead of said second stage an output signal of a predetermined logic level in response to said circuit entering said first phase, said second stage providing said output signal of said second stage independently of said output signal provided by said first stage during said first phase, and during said second phase, said second stage is operative to provide at said output lead of said second stage an output signal as a function of a logic level of said output signal of said first stage; and an unclocked buffer having an input lead coupled to said output lead of said second stage, wherein said buffer is operative to provide at an output lead an output signal as a function only of a logic level of said output signal from said second stage.

2. The circuit of claim 1 wherein said first stage comprises:

a first transistor having a first lead coupled to said first input lead of said first stage;

a second transistor having a first lead coupled to said second input lead of said first stage and having a second lead coupled to a second lead of said first transistor; and a third transistor having a first lead coupled to said first input lead of said first stage and having a second lead coupled to a third lead of said second transistor, wherein said second transistor, in response to said circuit entering said first phase, is operative to provide a conductive path between said first transistor and said output lead of said first stage.

3. The circuit of claim 1 wherein said unclocked buffer comprises an inverter.

4. The circuit of claim 1 wherein said circuit, when said first signal is provided by a dynamic logic gate, is operative to provide said output signal of said second stage with a maximum delay from a start of said second phase approximately equal to a time required to turn on one n-channel device.

5. The circuit of claim 1 wherein said first stage is operative to provide during said second phase said output signal from said first stage at a first logic level when said first signal received at said first input lead of said first stage is at a second logic level.

6. The circuit of claim 5 wherein said second stage is operative to provide during said second phase said output signal from said second stage having said first logic level when said output signal received from said first stage is at said second logic level.

7. The circuit of claim 1 further comprising:

a third stage having a first input lead, a second input lead and an output lead, said first input lead of said third stage coupled to receive a third signal and said second input lead of said third stage coupled to receive said second signal, wherein;

during said first phase, said third stage is operative to provide at said output lead of said third stage an output signal as a function of a logic level of said third signal received at said first input lead of said third stage, and during said second phase, said third stage is operative to provide at said output lead of said third stage an output signal as a function of a logic level of said third signal;

a fourth stage having a first input lead coupled to said output lead of said third stage, a second output lead coupled to said second input lead of said third stage, and an output lead, wherein:

during said first phase, said fourth stage is operative to provide at said output lead of said fourth stage an output signal of said predetermined logic level in response to said circuit entering said first phase, said fourth stage providing said output signal of said fourth stage independently of said output signal provided by said third stage during said first phase, and during said second phase, said fourth stage is operative to provide at said output lead of said fourth stage an output signal as a function of a logic level of said output signal of said third stage, and a second buffer having an input lead coupled to said output lead of said fourth stage, wherein said second buffer is operative to provide at an output lead an output signal as a function only of a logic level of said output signal from fourth stage.

8. The circuit of claim 7 wherein said second buffer comprises an inverter.

9. The circuit of claim 7 wherein said circuit has a hold time of approximately zero.

10. The circuit of claim 7 wherein said circuit has a delay relative to a start of said second phase, approximately equal the delay of two n-channel devices and a buffer, with one of the two n-channel devices already turned on at the start of the second phase.

11. The circuit of claim 7 wherein said circuit has a set-up time of approximately zero.

12. The circuit of claim 11 wherein said set-up time may be negative.

* * * * *